United States Patent

Tanaka et al.

[11] Patent Number: 5,867,469
[45] Date of Patent: Feb. 2, 1999

[54] OPTICAL PICKUP DEVICE WITH BIAXIAL DRIVE FOR OBJECTIVE LENS

[75] Inventors: Kiyoshi Tanaka; Chiaki Kojima, both of Kanagawa, Japan

[73] Assignee: Sony Corporation, Tokyo, Japan

[21] Appl. No.: 921,632

[22] Filed: Aug. 27, 1997

[30] Foreign Application Priority Data

Aug. 27, 1996 [JP] Japan .................................. 8-244077

[51] Int. Cl.$^6$ ...................................................... G11B 7/09
[52] U.S. Cl. ........................ 369/121; 369/44.12; 369/122
[58] Field of Search ................................ 369/121, 44.12, 369/112, 120, 122

[56] References Cited

U.S. PATENT DOCUMENTS 5,581,523  12/1996  Seki et al. ............................ 369/44.11
5,689,492  11/1997  Brazas et al. ........................... 369/112

Primary Examiner—Todd R. Swann
Assistant Examiner—Kim-Kwok Chu
Attorney, Agent, or Firm—Hill & Simpson

[57] ABSTRACT

A laser light detect/emit package 3 and a biaxial drive portion 5 for driving the objective lens 4 are supported on a wiring board 1 having wiring patterns 2a and 2b to electrically connect them to the wiring patterns 2a and 2b. Packaged in the laser light detect/emit package 3 are a laser coupler 11 having an optical prism 15 and a laser chip 16 formed on a photo diode IC 14 including photo diodes 12 and 13 for detecting optical signals. In lieu of the laser light detect/emit package 3, an auxiliary wiring board supporting the laser coupler 11 may be inserted and held in a recess formed in the wiring board 1.

19 Claims, 13 Drawing Sheets

OPTICAL PICKUP DEVICE WITH BIAXIAL DRIVE FOR OBJECTIVE LENS

BACKGROUND OF THE INVENTION

The present invention relates to an optical pickup device suitable for use in, for example, a portable or on-board optical disc device.

FIGS. 15 and 16 show two conventional optical pickup devices.

The conventional optical pickup device shown in FIG. 15 includes a base portion 101 made of die-cast zinc or aluminum on which biaxial drive portion 103 for moving an objective lens 102 in X, Y and Z directions, a laser light emitting portion 104 for emitting laser light, and an optical signal detecting portion 105 in form of a photo diode, for example, are fixed. In addition to these, the base portion 101 supports connection substrate materials 106 and 107 in form of a flexible substrate, glass epoxy substrate, or the like, that are fixed to the base portion 106 by an adhesive or a screws. These connection substrate materials 106 and 107 connect the biaxial drive portion 103, laser light emitting portion 104 and optical signal detecting portion 105 to an external servo circuit or RF signal processor not shown. Numeral 108 denotes a cover protecting the biaxial drive portion 103, and numeral 109 denotes a feeding guide.

Another conventional pickup device shown in FIG. 16 includes a base portion 201 of die cast zinc or aluminum similar to the base portion 101 mentioned above, on which are secured by a biaxial drive portion (not shown), protected by a cover 202, for moving an objective lens 203 in X, Y and Z directions, and a laser light detect/emit portion 204 packaging a laser light emitting portion for emitting laser light and an optical signal detecting portion. The biaxial drive portion and the laser light emitting portion 204 are connected to an external servo circuit, an RF signal processor, and so forth, by connection substrate materials 205 and 206 fixed to the base portion 201, which are similar to the connection substrate materials 106 and 107 mentioned above.

However, with respect to the conventional optical pick up devices shown in FIGS. 15 and 16 there are difficulties in decreasing their dimensions and thicknesses and in simplifying their manufacturing process because of their structures which use packaged parts put on the base portions and which must fix to the base portions the connection substrate materials for connecting the packaged parts to external servo circuits, RF signal processors, or the like.

SUMMARY OF THE INVENTION

It is an object of the invention to provide an optical pickup device which can provide a reduction in dimensions and thicknesses, simplification of the manufacturing process, and a decrease in manufacturing cost with respect to such conventional devices.

In an embodiment of the invention, there is provided an optical pickup device comprising: a wiring board having wiring patterns for electrical interconnection; a light detect/emit package or a light detect/emit wiring board on the wiring board for electrical connection to the wiring pattern and having a light emitting portion and an optical signal detecting portion; and a biaxial drive portion on the wiring board for electrical connection to the wiring pattern for driving an objective lens.

The optical pickup device can include an external-leading connector put on the wiring board for electrical connection to the wiring pattern. The external-leading connector connects the optical pickup device to an external servo circuit, RF signal processor, or other like element.

The wiring board may have a recess which accepts the light detect/emit wiring board therein. In this case, the light detect/emit wiring board can be disposed normal to the wiring board. To minimize astigmatism of light emitted from the light emitting portion, an optical axis of the light emitting portion on the light detect/emit wiring board is preferably angled by 45° with respect to the normal of the wiring board.

The wiring board may be partly cut and bent up so that the light detect/emit wiring board can be attached to the cut-and-bent portion. The cut-and-bent portion can be substantially normal to the wiring board. In order to minimize the astigmatism of light emitted from the light emitting portion, the optical axis of the light emitting portion on the light detect/emit wiring board is preferably angled by 45° with respect to the normal of the wiring board.

In the optical pickup device having the above construction according to the invention in which both the light detect/emit package or light detect/emit substrate with the light emitting portion and the optical signal detecting portion and the biaxial drive portion for driving the objective lens are supported on the wiring board having the connection wiring patterns to electrically connect them to the wiring pattern, the optical pickup device needs no connection substrate material, and can be made in a miniaturized and thin form in a simplified and inexpensive manufacturing process.

These and other aspects and features of the invention are discussed in greater detail below in the following detailed description of the presently preferred embodiments with reference to the accompanying drawings.

DETAILED DESCRIPTION OF THE PRESENTLY PREFERRED EMBODIMENTS

Figure 1A:
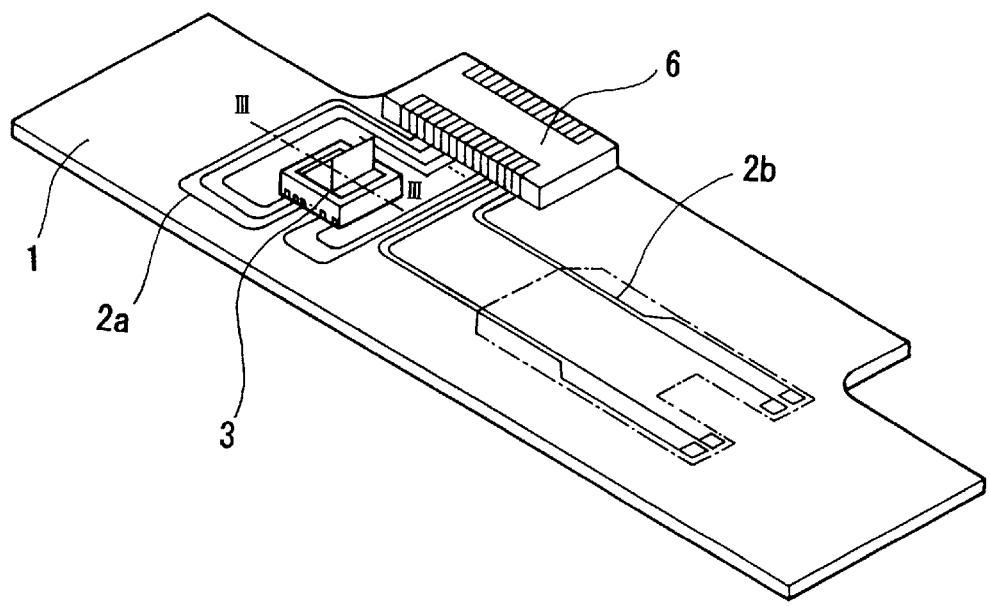
FIGS. 1A and 1B illustrate perspective views of an optical pickup device according to a first embodiment of the invention.
Figure 1B:
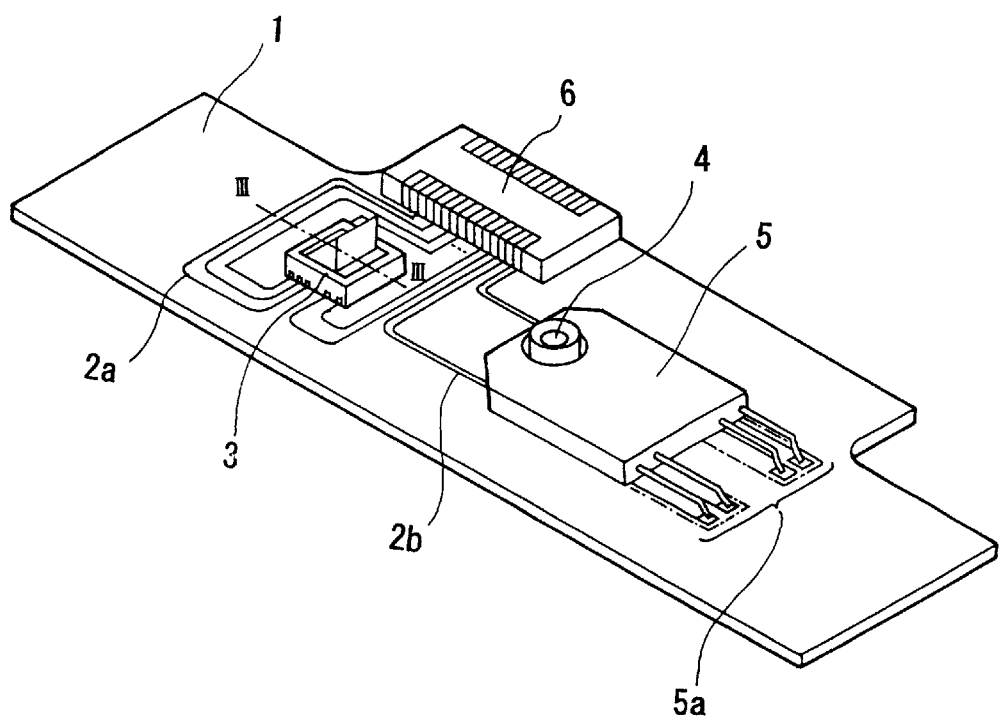

FIGS. 1A and 1B show an optical pickup device according to a first embodiment of the invention. FIG. 1A shows an aspect of the device before a biaxial device is fixed on a wiring board, and FIG. 1B shows an aspect of the device after the biaxial device is fixed on the wiring board.

As shown in FIGS. 1A and 1B, in an optical pickup device according to a first embodiment of the invention, a wiring board 1 in the form of a multi-layered structure having a suitable mechanical strength, has wiring patterns 2a and 2b for electrical interconnections, and fixedly supports thereon a laser light detect/emit package 3, a biaxial device 5 for driving an objective lens 4 in X, Y and Z directions, and an external-leading connector 6. The multilayered structure may be made by providing a glass epoxy resin over a copper-laminated multilayer structure, an iron based material, or a ceramic.

Figure 2:
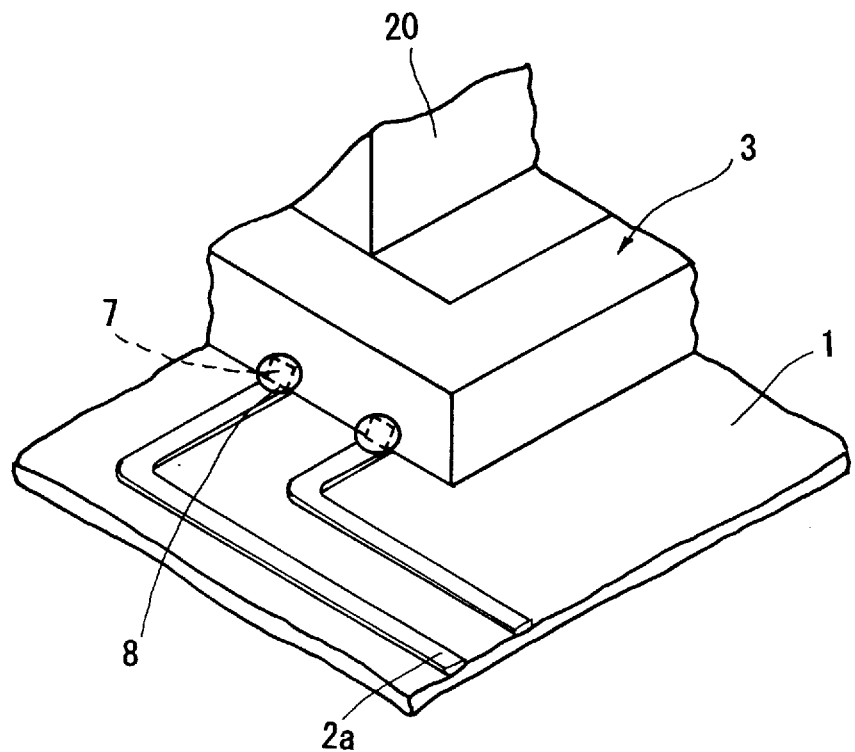
FIG. 2 illustrates a fragmentary perspective view in an enlarged scale of the optical pickup device according to the first embodiment of the invention.

In this case, the laser light detect/emit package 3 and the biaxial device 5 are secured onto the wiring board 1 with an adhesive (not shown) having a sufficiently great heat transfer property, such as silver paste. The laser light detect/emit package 3 is electrically connected to one end of the wiring pattern 2a. More specifically, as shown in FIG. 2, side electrodes 7 of the laser light detect/emit package 3 are electrically connected to one end of the wiring pattern 2a on the wiring board 1 with soldering 8. As shown in FIG. 1B, connection terminals 5a of the biaxial device 5 are soldered for electrical connection to one end of the wiring pattern 2b. The other ends of the wiring patterns 2a and 2b are connected to terminals of the external-leading connector 6 which is connected to an external servo circuit or RF signal processor, not shown.

Figure 3:
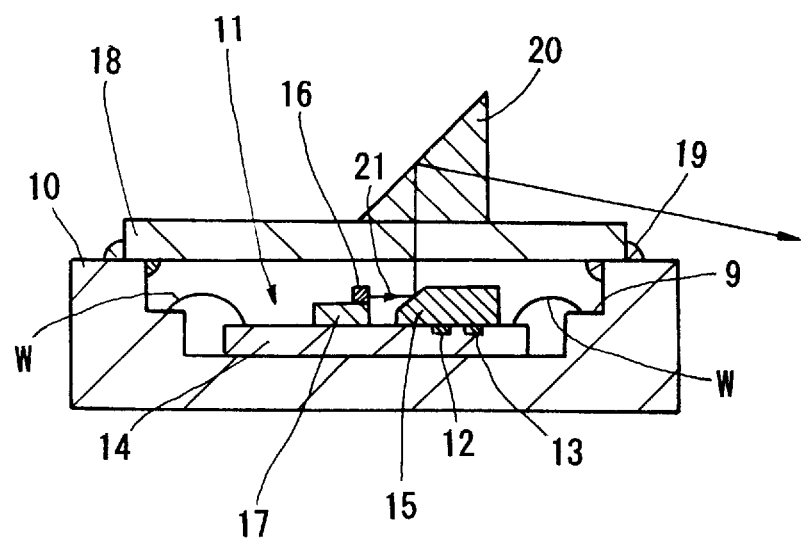
FIG. 3 illustrates a cross-sectional view of a laser light detect/emit package in the optical pickup device according to the first embodiment of the invention.

FIG. 3 is a cross-sectional view taken along the line III—III of FIG. 1A showing a construction of the laser light detect/emit package 3. As shown in FIG. 3, the laser light detect/emit package 3 includes a package 10 in form of a ceramic package or mold resin package, for example, having a wire-bonding land 9, and a laser coupler 11 mounted in the package 10. The laser coupler 11 includes a photo diode IC 14 having a pair of photo diodes 12 and 13 for detection of optical signals, on which an optical prism 15 overlying the photo diodes 12 and 13 and a block 17 supporting a laser chip 16, for example, semiconductor laser, are mounted face-to-face. The photo diode IC 14 and the wire-bonding land 9 are connected by a wire W, and the wire-bonding land 9 is electrically connected to the side electrode 7 of the package 10. Further fixed on the package 10 is a seal cover 19 made of glass, for example, with a sealing material 19 excellent in moisture-proofing properties. Mounted on the seal cover 18 is a triangle or transfer prism 20.

The triangle prism 20 is mounted in a position where laser light 21 emitted from the laser chip 16 of the laser coupler 11 is reflected by a reflective plane of the optical prism 15, then reflected by the inner side of a slanting plane of the triangle prism 20 toward the biaxial device 5 and that laser light 21 returning through the opposite paths enter in the photo diodes 12 and 13 on the photo diode IC 14. More specifically, the mounting position of the triangle prism 20 is determined by emitting laser light 21 from the laser chip 16 and by monitoring outputs of the photo diodes 12 and 13 while probing the side electrodes 7 of the package 10 after sealing the package 10 by the seal cover 18.

Figure 17:
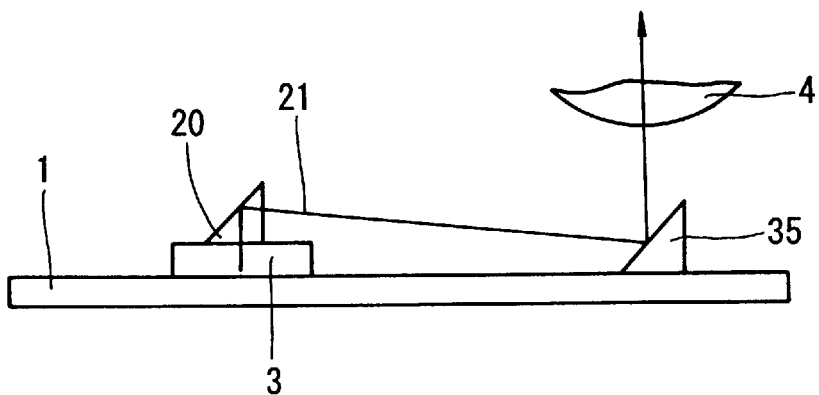
FIG. 17 illustrates in schematic side elevational view a portion of the laser light detect/emit portion of FIG. 1B.

In the optical pickup device according to the first embodiment, the laser light 21 emitted from the laser chip 16 is reflected by the reflective plane of the optical prism 15, then reflected by the inner side of the slanting plane of the triangle prism 21, thereafter reflected by a standing mirror 35 (as shown in FIG. 17) formed on a part of the wiring board 1 under the objective lens 4, and then projected onto a plane of an optical disc such as compact disc (CD), for example, via the objective lens 4. The laser light 21 reflected by the plane of the optical disc runs in the opposite direction, reflected by the inner side of the slanting plane of the triangle prism 20, passes through the optical prism 14, and enters in the photo diodes 12 and 13. As a result, optical signals are detected to reproduce the optical disc.

As explained above, according to the first embodiment, since the laser light detect/emit package 3, biaxial device 5 and external-leading connector 6 are fixedly mounted on the wiring board 1 having wiring patterns 2a and 2b for connection such that the elements are connected to the wiring patterns, the device needs no connection substrate material as has been used in the conventional optical pickup devices discussed above, and can be made in a smaller and thinner form via an easier and more inexpensive manufacturing process.

The first embodiment has the following additional advantages.

It is possible to mount the laser coupler 11 directly onto the wiring board 1 using silver paste, for example. In this case, however, the laser coupler 11 must be sealed by bonding a cover onto the wiring board 1 so as to cover the laser coupler 11 in order to ensure a reliability even under a high temperature and a high humidity. It is also necessary to attach a return mirror, astigmatism correction plate, etc. onto the inner top surface of the cover. If the cover is bonded rigidly to reliably protect the laser coupler 11 from heat and moisture, then a stress is produced due to a difference in linear expansion coefficient between the bonding agent used and the wiring board 1, and this causes deterioration in characteristics of the return mirror and the astigmatism correction plate attached to the inner top surface of the cover of the laser coupler 11. In the first embodiment, however, since the laser coupler 11 is mounted in the package 10 of the laser light detect/emit package 3 and sealed by the seal cover 18, and the triangle prism 20 equivalent to the return mirror is mounted on the seal cover 18, adverse effects due to stress caused by the seal of the package 10 can be minimized, which increases the reliability of the laser light detect/emit package 3 and the reliability of the optical pickup device. Especially when a ceramic package is used as the package 10, and the seal cover 18 is made of glass, much more reliability should be possible.

Figure 4A:
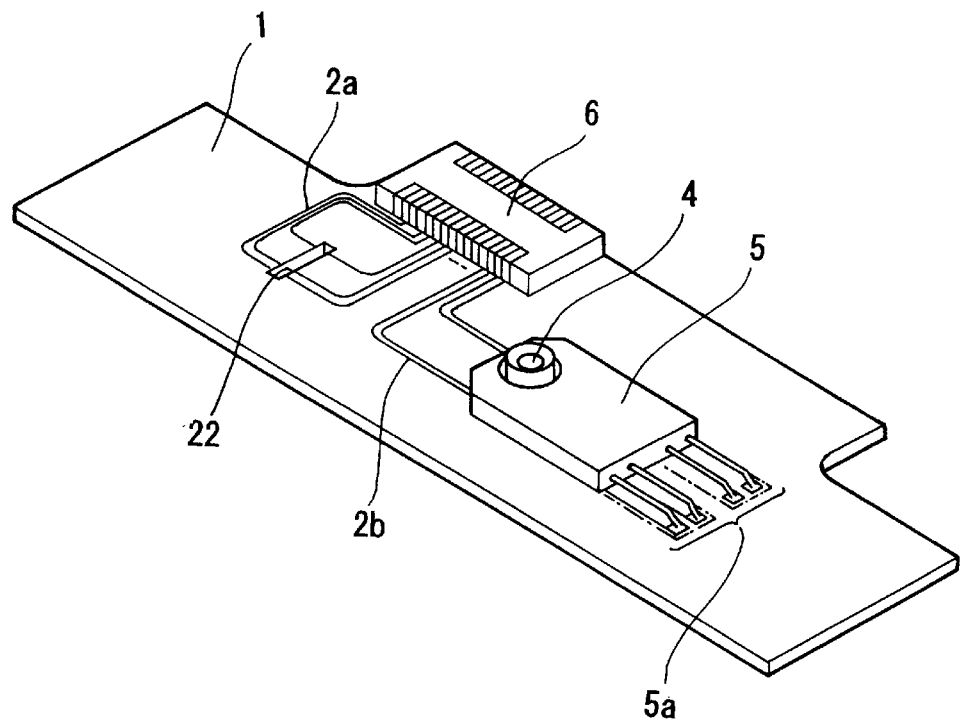
FIGS. 4A and 4B illustrate perspective views of an optical pickup device according to a second embodiment of the invention.
Figure 4B:
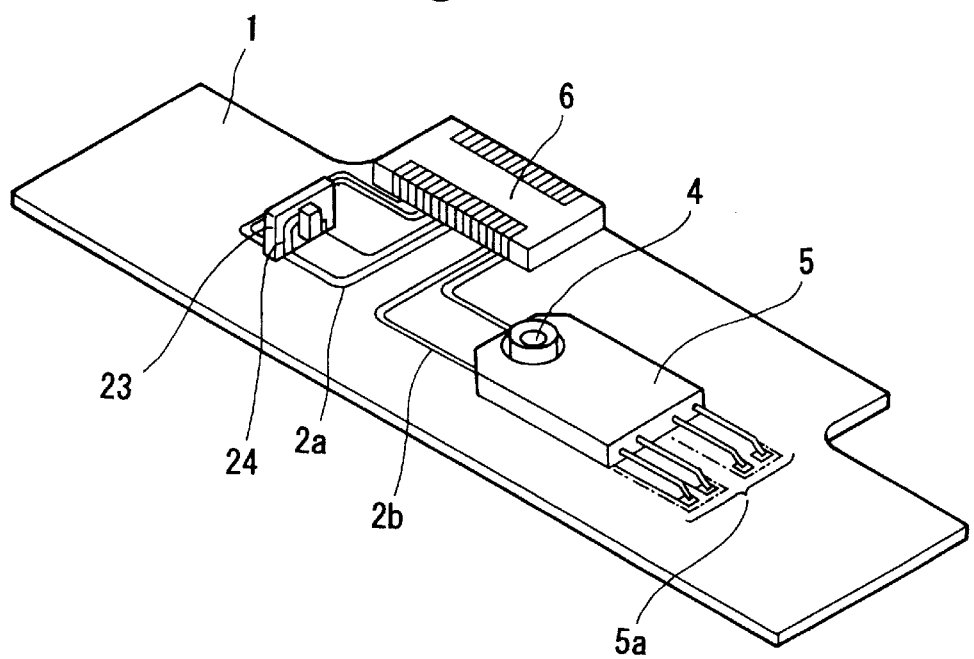

FIGS. 4A and 4B show another optical pickup device as a second embodiment of the invention. FIG. 4A shows an aspect of the device before a biaxial device is fixed on a wiring board, and FIG. 4B shows an aspect of the device after the biaxial device is fixed on the wiring board.

As shown in FIGS. 4A and 4B, in the optical pickup device according to the second embodiment, the wiring board 1 similar to that of the first embodiment has wiring patterns 2a and 2b for electrical interconnections, and the biaxial device 5 for moving the objective lens 4 in X, Y and Z directions and the external-leading connector 6 are fixedly supported on the wiring board 1. In the same manner as the first embodiment, connection terminals 5a of the biaxial device 5 are electrically connected to one end of the wiring pattern 2b, and the other ends of the wiring patterns are connected to terminals of the external-leading connector 6 which is connected to an external servo circuit, RF signal processor, or the like. The wiring board 1 also has a recess 22 for accepting an auxiliary wiring board. Thus, the auxiliary wiring board 23 for detecting and emitting light is inserted into and held in the recess 22 vertically with respect to the wiring board 1.

Figure 5:
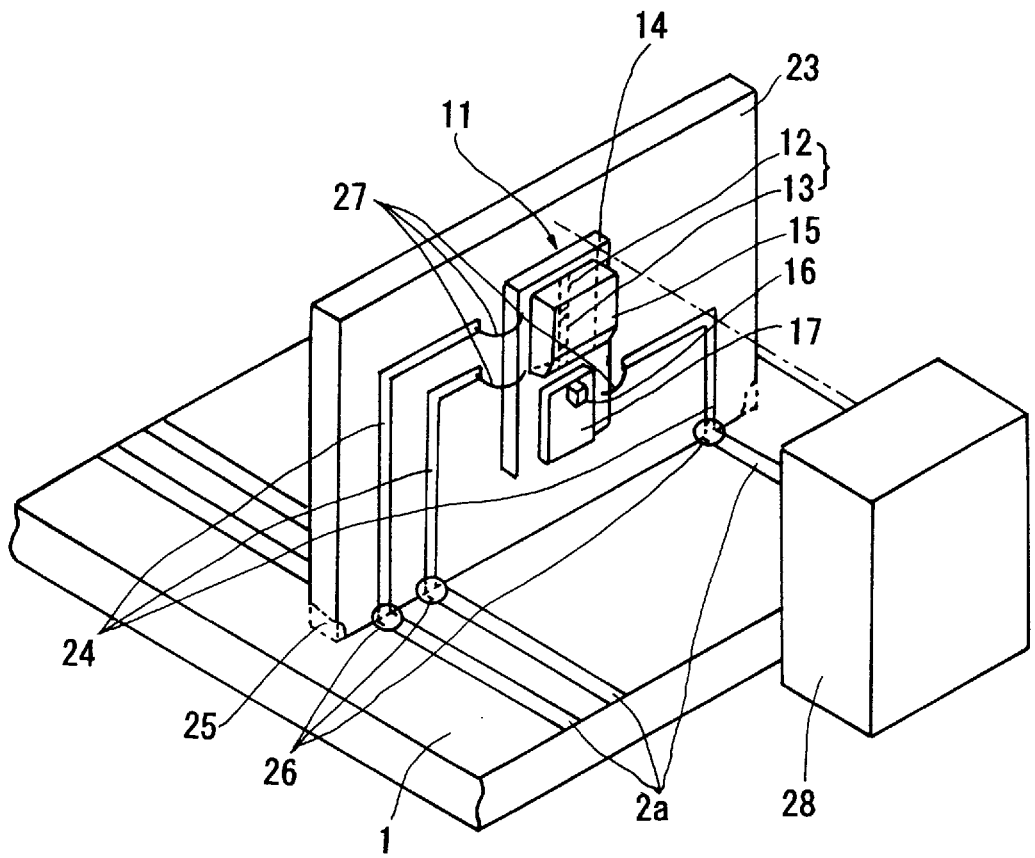
FIG. 5 illustrates a fragmentary perspective view on an enlarged scale of the optical pickup device according to the second embodiment of the invention.

FIG. 5 shows a construction of the auxiliary wiring board 23. As shown in FIG. 5, the auxiliary wiring board 23 is a multilayered structure. The multilayered structure may be made by providing a glass epoxy resin over a copper-laminated multilayer structure, an iron based material, or a ceramic. The auxiliary wiring board 23 has a suitable mechanical strength, and has a wiring pattern 24 for electrical interconnections. The auxiliary wiring board 23 is bonded to the wiring board 1 by an adhesive 25 applied to its side edges crossing the wiring board 1. The wiring pattern 24 of the auxiliary wiring board 23 is connected to one end of the wiring pattern 2a on the wiring board 1 by soldering 26.

Mounted on one surface of the auxiliary wiring board 23 is the laser coupler 11 secured by silver paste. In this case, the optical axis from the laser chip 16 in the laser coupler 11 is normal to the wiring board 1. A bonding pad (not shown) applied along the peripheral portion of the photo diode IC 14 is bonded to one end of the wiring pattern 24 by a wire 27. The laser coupler 11 is sealed by a rectangular box-shaped seal cover 28. The seal cover 28 is bonded onto the auxiliary wiring board 23 by an adhesive (not shown). The seal cover 28 is entirely made of a transparent material, such as transparent mold resin, or has a window made of a transparent material in the light path of the seal cover 28.

Figure 6:
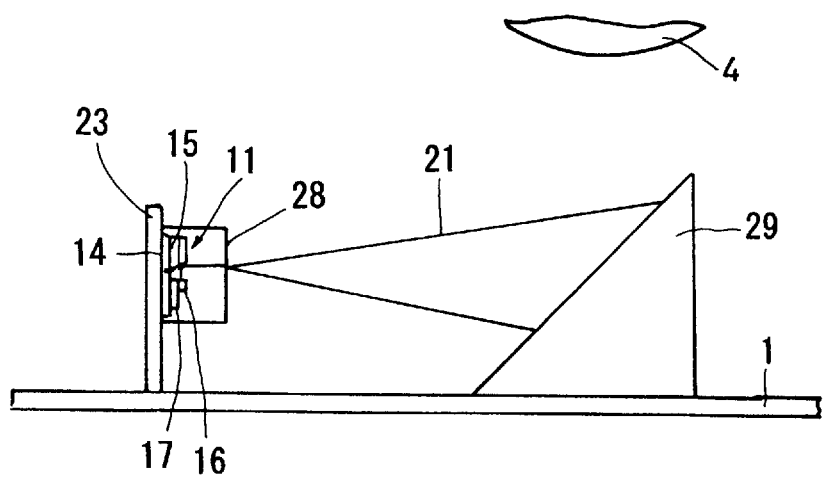
FIG. 6 illustrates a side elevation of the optical pickup device according to the second embodiment of the invention for explaining the mounting position of a laser coupler on an auxiliary wiring board.

The laser coupler 11 is mounted in a height as shown in FIG. 6 where laser light 21 emitted from the laser chip 16 and reflected by the reflective plane of the optical prism 15 is not kicked by the wiring board 1 before reaching a standing mirror 29 formed on a part of the wiring board 1 under the objective lens 4.

Auxiliary wiring boards 23 may be fabricated individually. Preferably, however, they are fabricated in the form of a block of severable pieces. For example, a collective auxiliary wiring board of a size containing some pieces of auxiliary wiring boards 23 is prepared and subjected to a sequence of steps for mounting laser couplers 11 on the collective board (die bonding), bonding by wires 27 and sealing by seal covers 28. After that, the collective auxiliary wiring board is cut and separated into discrete auxiliary wiring boards 23.

As explained above, according to the second embodiment, since the biaxial device 5 and external-leading connector 6 are fixedly mounted on the wiring board 1 having wiring patterns 2a and 2b for connections, and the auxiliary wiring board 23 is mounted in the recess 22 formed in the wiring board 1, such that the laser coupler 11 mounted on the auxiliary wiring board 23 is connected to the wiring pattern 2a on the wiring bard 1 via the wiring pattern 24, the device needs no connection substrate material as has been used in the conventional optical pickup devices discussed above, and can be made in a smaller and thinner form in an easier and more inexpensive manufacturing process, like the first embodiment.

Moreover, since the seal cover 28 for sealing the laser coupler 11 can be formed in a simple shape, adverse effects due to a stress caused by the sealing by the seal cover 28 can be minimized, which results in increasing the reliability of the laser coupler 11 and the reliability of the optical pickup device. Also the process of sealing by the seal cover 28 is very easy.

Figure 7A:
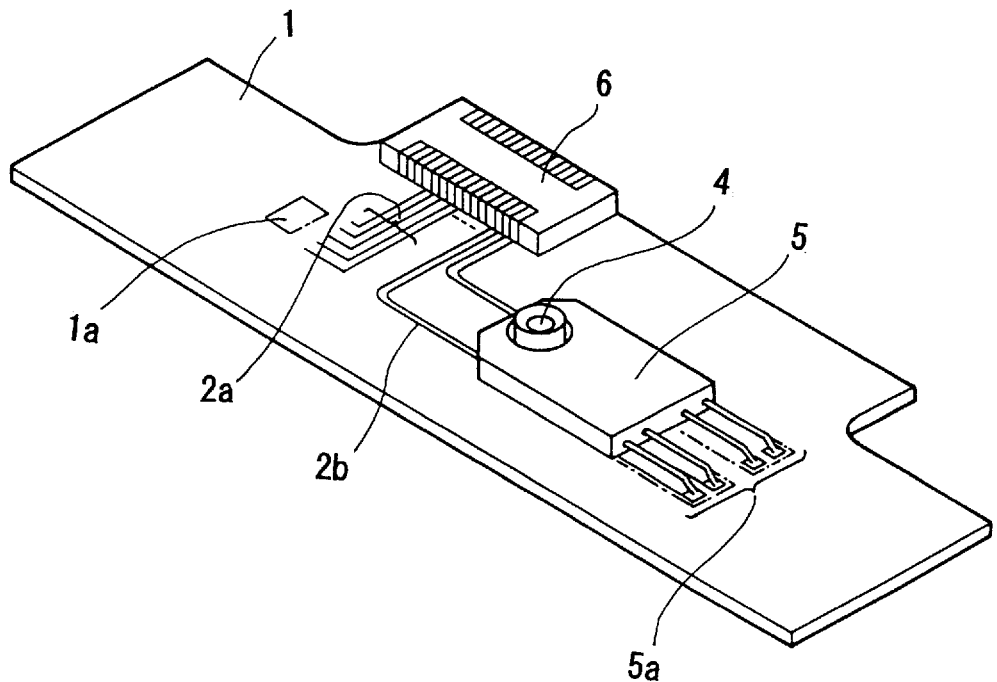
FIGS. 7A and 7B illustrate perspective views of an optical pickup device according to a third embodiment of the invention.
Figure 7B:
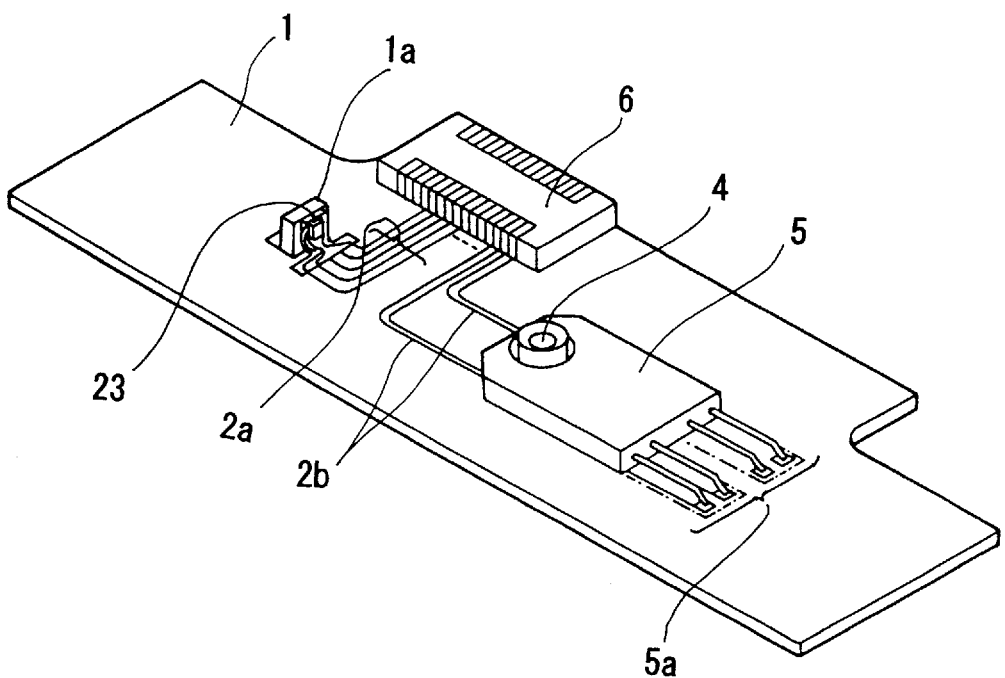

FIGS. 7A and 7B show another optical pickup device as a third embodiment of the invention. FIG. 7A shows an aspect of the device before a biaxial device is fixed on a wiring board, and FIG. 7B shows an aspect of the device after the biaxial device is fixed on the wiring board.

As shown in FIGS. 7A and 7B, in the optical pickup device according to the third embodiment, the wiring board 1 similar to that of the first embodiment has wiring patterns 2a and 2b for electrical interconnections, and the biaxial device 5 for moving the objective lens 4 in X, Y and Z directions and the external-leading connector 6 are fixedly supported on the wiring board 1. In the same manner as the first embodiment, connection terminals 5a of the biaxial device 5 are electrically connected to one end of the wiring pattern 2b, and the other ends of the wiring patterns are connected to terminals of the external-leading connector 6 which is connected to an external servo circuit, RF signal processor, or the like. The wiring board 1 has further formed a cut-and-bent portion 1a made by cutting and bending vertically upwardly apart thereof with respect to the wiring board 1, and an auxiliary wiring board 23 similar to that of the second embodiment is bonded to one surface of the cut-and-bent portion 1a.

Figure 8:
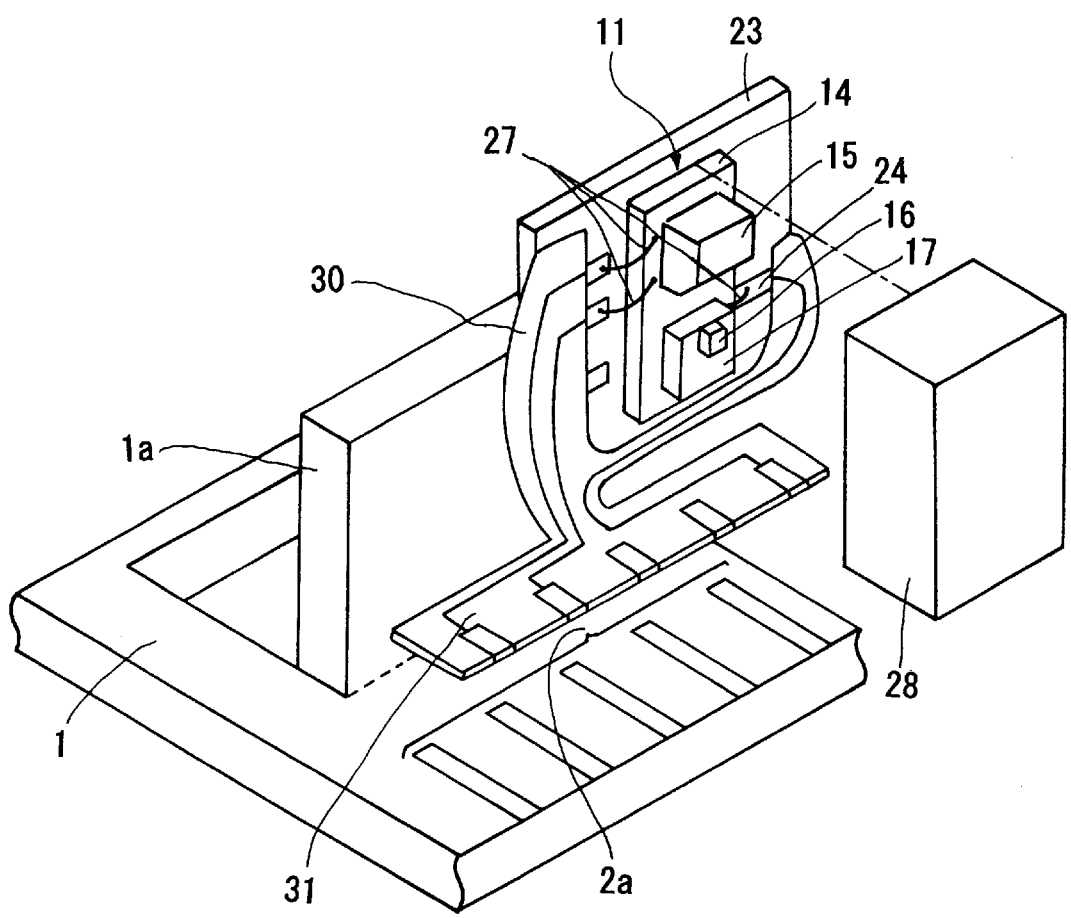
FIG. 8 illustrates a fragmentary perspective view on an enlarged scale of the optical pickup device according to the third embodiment of the invention.

As shown in FIG. 8, electrical connections of the wiring pattern 24 on the auxiliary wiring board 23 attached to the cut-and-bent portion 1a of the wiring board 1 to the wiring pattern 2a on the wiring board 1 is made by using a flexible wiring 30. Namely, one end of the flexible wiring 30 is soldered to the wiring pattern 24 on the auxiliary wiring board 23, and a flexible electrode portion 31 at the other end of the flexible wiring 30 is soldered to the wiring pattern 2a on the wiring board 1.

The location and orientation of the laser coupler 11 on the auxiliary wiring board 23 are the same as those of the second embodiment. Also the sealing of the laser coupler 11 by the rectangular box-shaped seal cover 28 is the same as the second embodiment. The height of the position of the laser coupler 11 on the auxiliary wiring board 23 is here again selected to prevent that the laser light 21 is kicked by the wiring board 1 in the same manner as the second embodiment.

As explained above, according to the third embodiment, since the biaxial device 5 and external-leading connector 6 are fixedly mounted on the wiring board 1 having wiring patterns 2a and 2b for connection, and the auxiliary wiring board 23 is fixed to the cut-and-bent portion 1a formed on the wiring board 1, such that the laser coupler 11 mounted on the auxiliary wiring board 23 is connected to the wiring pattern 2a on the wiring board 1 via the flexible wiring 30, the device needs no connection substrate material as has been used in the conventional optical pickup devices discussed above, and can be made in a smaller and thinner form in an easier and more inexpensive manufacturing process, like the first and second embodiments.

Moreover, here again, since the seal cover 28 for sealing the laser coupler 11 can be formed in a simple shape, adverse effects due to stress caused by the sealing by the seal cover 28 can be minimized, which results in increasing the reliability of the laser coupler 11 and the reliability of the optical pickup device. Also the process of sealing by the seal cover 28 is very easy.

Figure 9A:
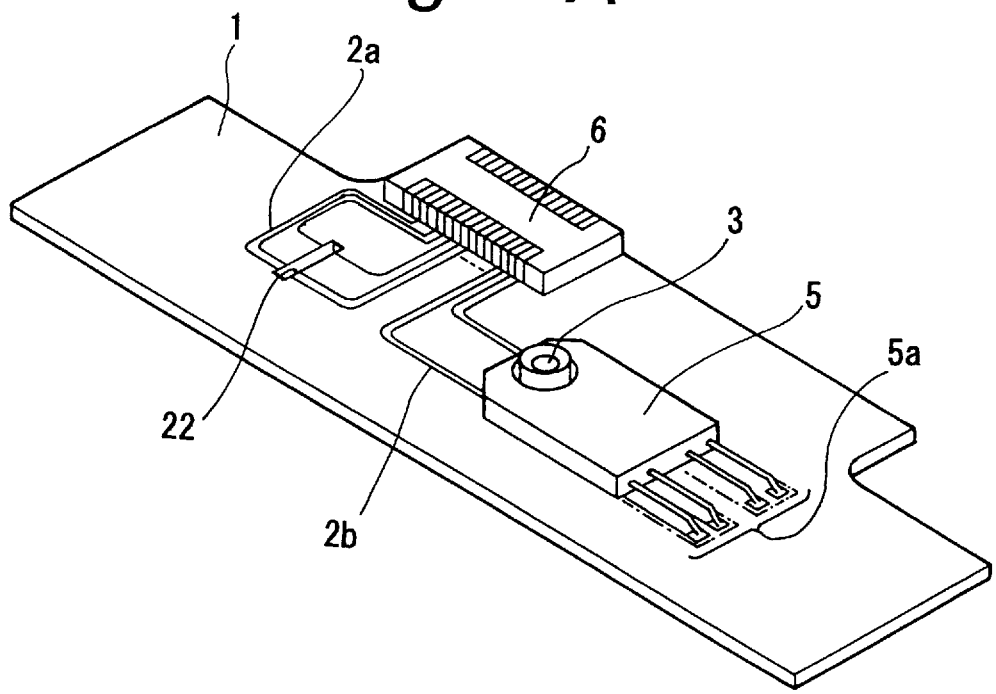
FIGS. 9A and 9B illustrate perspective views of an optical pickup device according to a fourth embodiment of the invention.
Figure 9B:
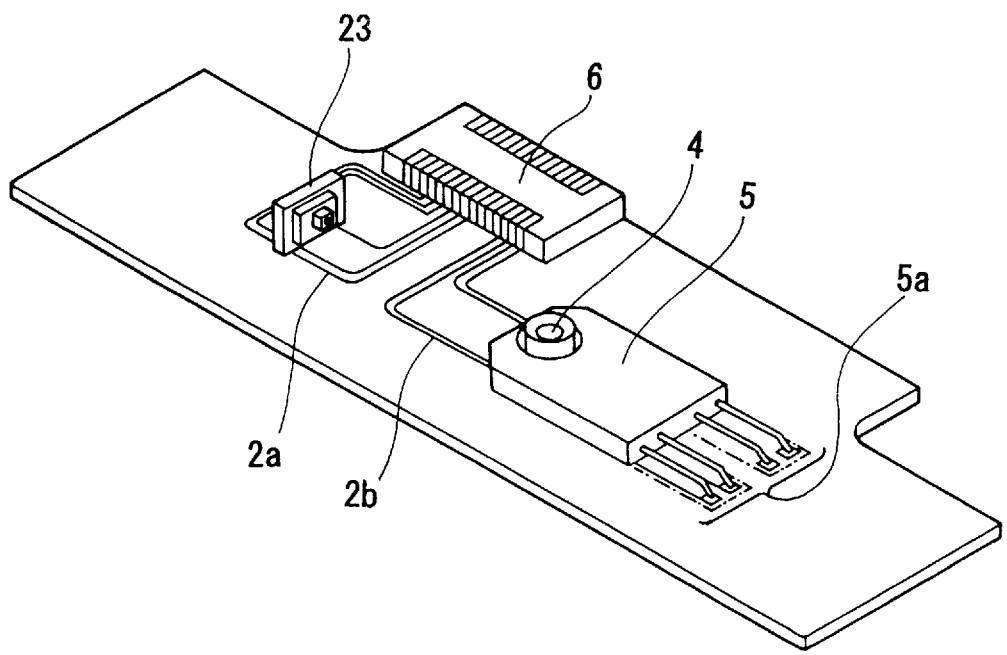

FIGS. 9A and 9B show another optical pickup device as a fourth embodiment of the invention. FIG. 9A shows an aspect of the device before a biaxial device is fixed on a wiring board, and FIG. 9B shows an aspect of the device after the biaxial device is fixed on the wiring board.

As shown in FIGS. 9A and 9B, in the optical pickup device according to the fourth embodiment, the wiring board 1 similar to that of the first embodiment has wiring patterns 2a and 2b for electrical interconnections, and the biaxial device 5 for moving the objective lens 4 in X, Y and Z directions and the external-leading connector 6 are fixedly supported on the wiring board 1. In the same manner as the first embodiment, connection terminals 5a of the biaxial device 5 are electrically connected to one end of the wiring pattern 2b, and the other ends of the wiring patterns are connected to terminals of the external-leading connector 6 which is connected to an external servo circuit, RF signal processor, or the like. In the same manner as the second embodiment, the wiring board 1 also has a recess 22 for accepting an auxiliary wiring board. Thus, the auxiliary wiring board 23 for detecting and emitting light is inserted into and held in the recess 22 vertically with respect to the wiring board 1.

Figure 10:
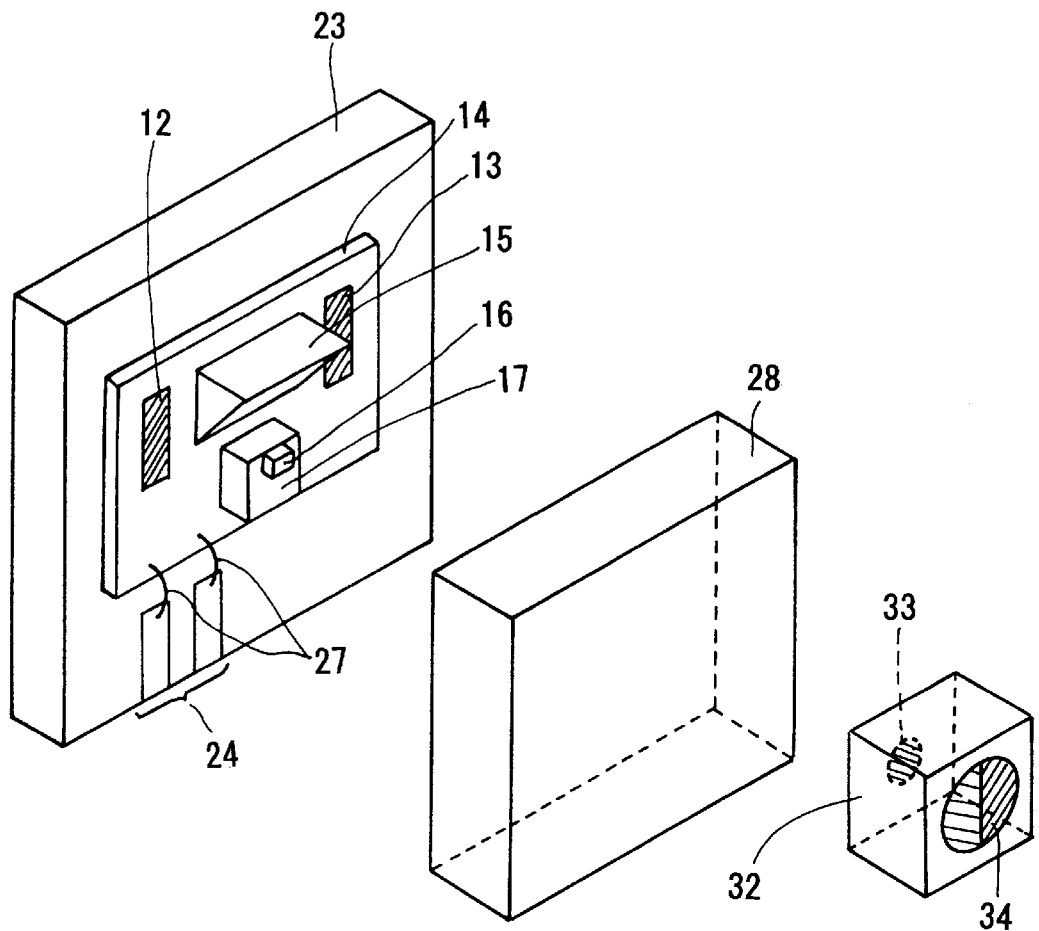
FIG. 10 illustrates a perspective view of an auxiliary wiring board in the optical pickup device according to the fourth embodiment of the invention.

FIG. 10 shows a construction of the auxiliary wiring board 23. As shown in FIG. 10, the auxiliary wiring board 23 has the wiring pattern 24 like that of the second embodiment. In the same manner as the second embodiment, the auxiliary wiring board 23 is bonded to the wiring board 1, and the wiring pattern 24 on the auxiliary wiring board 23 is soldered to the wiring pattern 2a on the wiring board 1.

Mounted on one surface of the auxiliary wiring board 23 is the laser coupler 11 secured by silver paste. In this case, a triangle prism is used as the optical prism 15. Photo diodes 12 and 13 are formed symmetrically at opposite sides of the optical prism 15, namely the triangle prism, on the photo diode IC 14. The optical axis common to the photo diodes 12 and 13 and the laser chip 16 on the photo diode IC 14 in the laser coupler 11 is normal to the wiring board 1. A bonding pad (not shown) applied along the peripheral portion of the photo diode IC 14 is bonded to one end of the wiring pattern 24 by a wire 27. The laser coupler 11 is sealed by a rectangular box-shaped seal cover 28. The seal cover 28 is bonded onto the auxiliary wiring board 23 by an adhesive (not shown). The seal cover 28 is entirely made of a transparent material, such as transparent mold resin, or has a window made of a transparent material. Bonded on the seal cover 28 is a block 32 by an adhesive (not shown). The block supports a grating 33 and a hologram 34 bonded to a pair of opposite surfaces, and is disposed to locate the grating 33 nearer to the seal cover 28.

Figure 11:
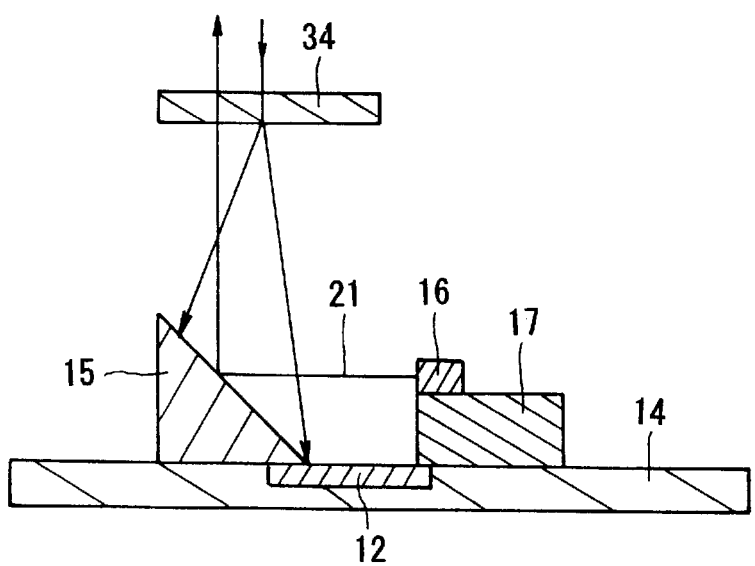
FIG. 11 illustrates a schematic diagram for the optical pickup device according to the fourth embodiment of the invention.

FIG. 11 illustrates laser light 21 emitted from the laser chip 16 of the laser coupler 11 and laser light 21 entering into the photo diodes 12 and 13 of a photo diode IC 14 of the laser coupler 11 when a grating 33 and the hologram 34 are used.

Here again, the height of the position of the laser coupler 11 on the auxiliary wiring board 23 is selected to prevent the laser light 21 from being kicked by the wiring board 1, like the second embodiment.

Auxiliary wiring boards 23 may be fabricated individually. Preferably, however, they are fabricated in form of a block of severable pieces. For example, a collective auxiliary wiring board of a size containing some pieces of auxiliary wiring boards 23 is prepared and subjected to a sequence of steps for mounting laser couplers 11 on the collective board (die bonding), bonding by wires 27 and sealing by seal covers 28. After that, the collective auxiliary wiring board is cut and separated into discrete auxiliary wiring boards 23. The block 32 supporting the grating 33 and the hologram 34 is adjusted in position by monitoring outputs of the photo diode IC 14 responsive to laser light 21 emitted from the laser chip 16 while probing the wiring pattern 24 on each of auxiliary wiring boards 23 obtained by cutting the collective auxiliary wiring board, and it is bonded at the determined position on the seal cover 28.

As explained above, according to the fourth embodiment, since the biaxial device 5 and external-leading connector 6 are fixedly mounted on the wiring board 1 having wiring patterns 2a and 2b, and the auxiliary wiring board 23 is fixed in the recess 22 formed in the wiring board 1, such that the laser coupler 11 mounted on the auxiliary wiring board 23 is connected to the wiring pattern 2a on the wiring board 1 via the wiring pattern 24, the device needs no connection substrate material as has been used in the conventional optical pickup devices discussed above, and can be made in a smaller and thinner form in an easier and more inexpensive manufacturing process, like the other embodiments.

Moreover, according to the fourth embodiment, since the block 32 supporting the grating 33 and the hologram 34 is bonded to the seal cover 28 after the seal cover 28 is bonded for sealing, adverse effects due to stress occurring upon sealing by the seal cover 28, if any, can be minimized, which results in increasing the reliability of the laser coupler 11 and the reliability of the optical pickup device. Also the process of sealing by the seal cover 28 is very easy.

Although the invention has been shown and described with respect to preferred embodiments thereof, the invention is not limited to these embodiments, but envisages various changes and modifications within the spirit and scope of the invention.

Figure 12:
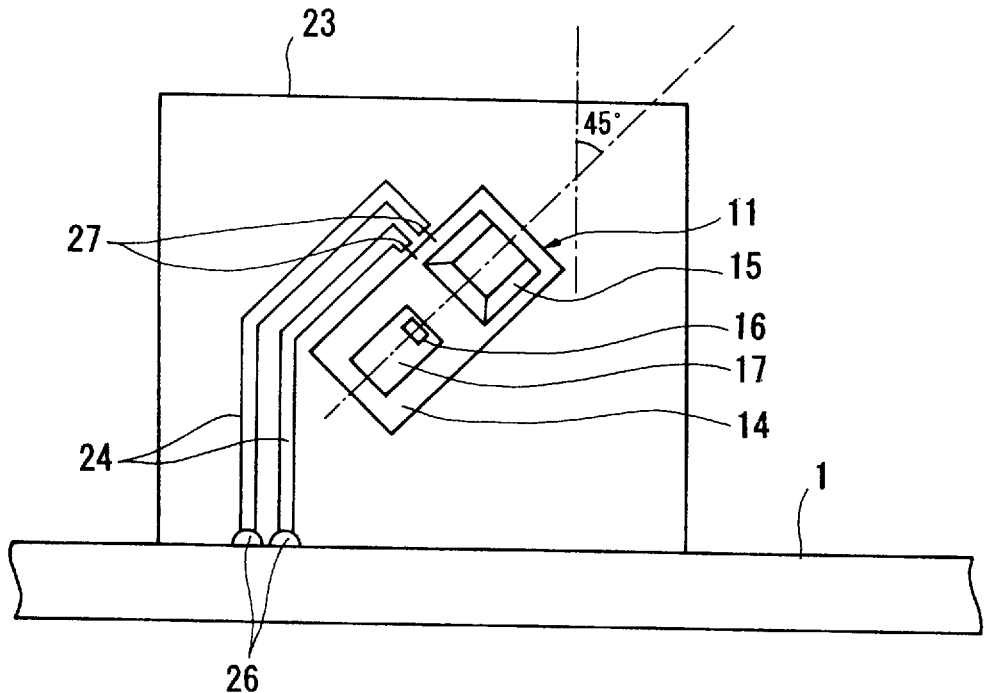
FIG. 12 illustrates a side elevational view of an optical pickup device according to yet another embodiment of the invention.

For example, although the second embodiment has been explained as orienting the optical axis of the laser chip 16 in the laser coupler 11 normal to the wiring board 1, the orientation of the optical axis is not limited to this, but may be modified appropriately. When the optical pickup device is used as one for CD, typically configured not to correct the astigmatism of laser light 21, the laser coupler 11 is preferably mounted on the auxiliary wiring board 23 so that the optical axis of the laser chip 16 be angled by 45° from the normal of the wiring board 1 as shown in FIG. 12.

Figure 13:
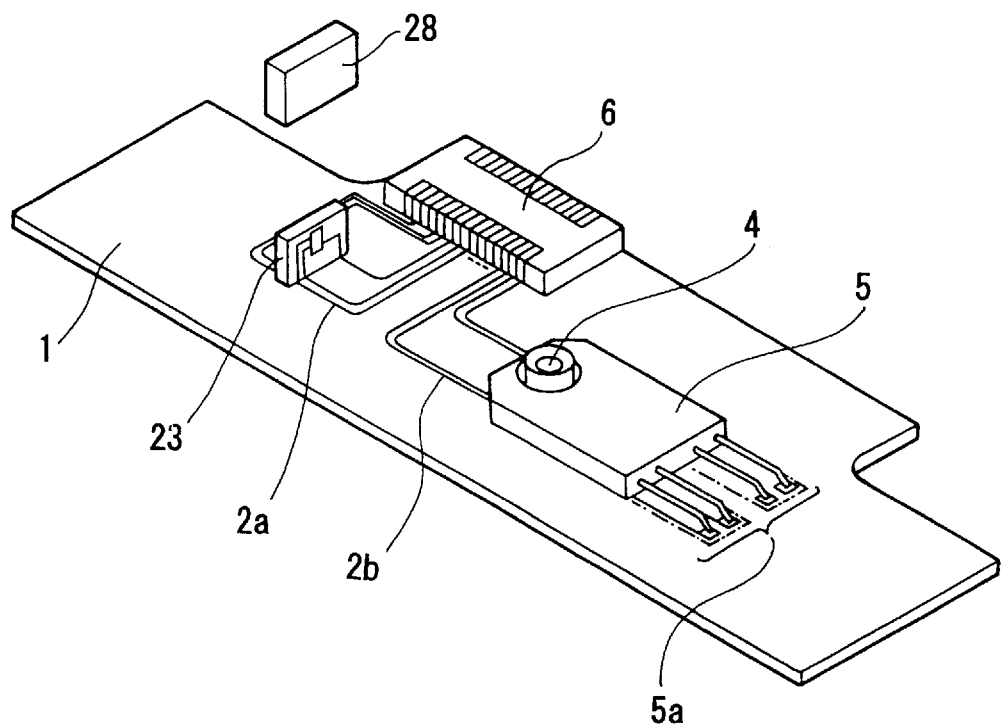
FIG. 13 illustrates a perspective view of an optical pickup device according to yet another embodiment of the invention.

Still referring to the second embodiment, although the seal cover 28 is provided to cover the laser coupler 11 on the auxiliary wiring board 23, a much larger seal cover 28 covering the entirety of the auxiliary wiring board 23 may be used and bonded to the wiring board 1 to seal the auxiliary wiring board 23 as shown in FIG. 13.

Still referring to the second embodiment, although the wiring patter 24 is formed on one surface of the auxiliary wiring board 23, the wiring pattern 24 may be formed to extend over opposite surfaces of the auxiliary wiring board and may be soldered to the wiring board 1 at opposite sides of the auxiliary wiring board 23. In this case, the bonding strength of the auxiliary substrate 23 to the wiring board 1 is increased.

Figure 14:
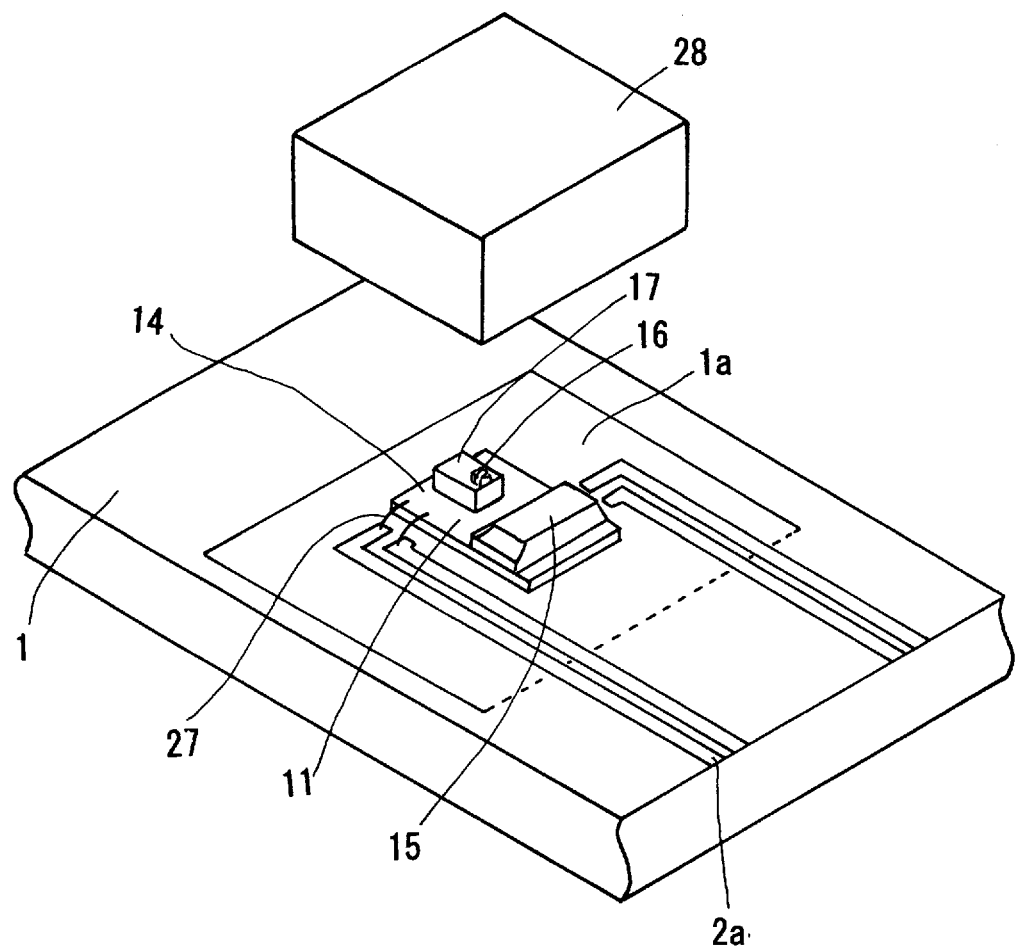
FIG. 14 illustrates a perspective view of an optical pickup device according to yet another embodiment of the invention.
Figure 15:
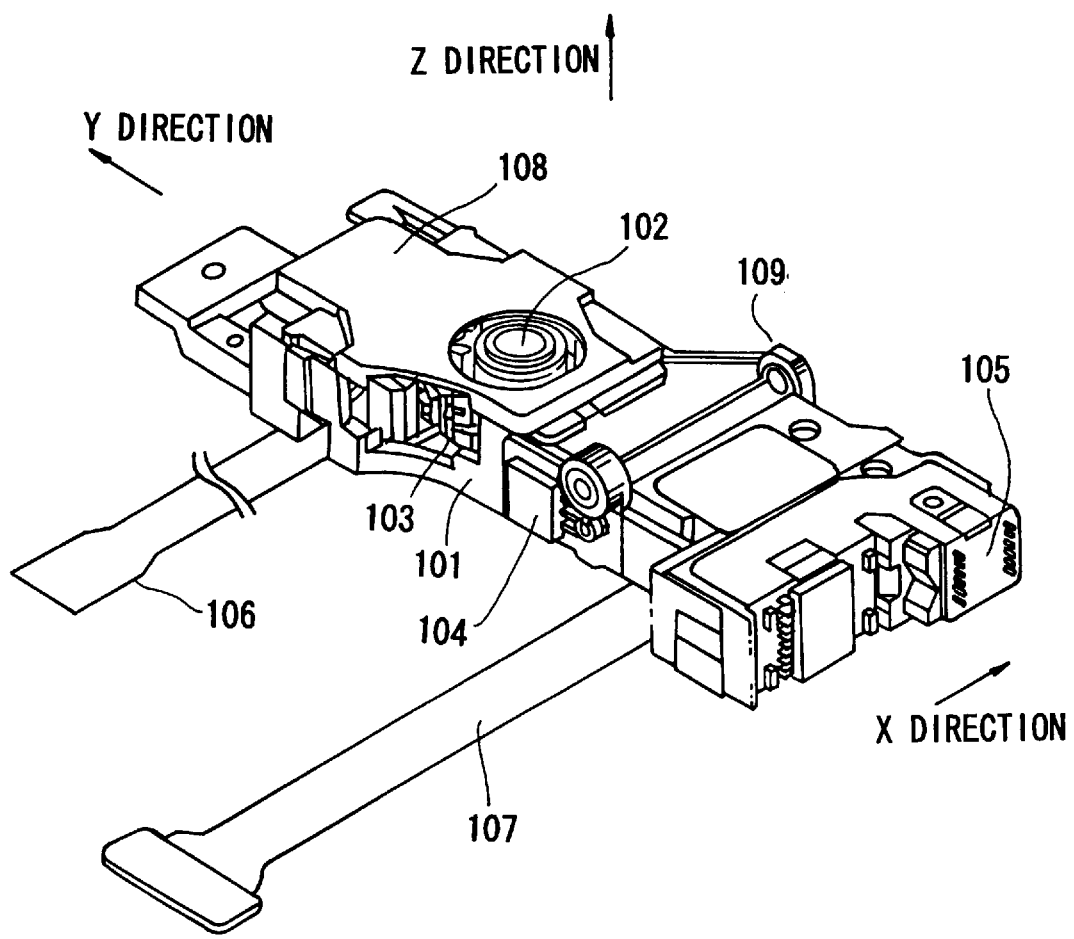
FIG. 15 illustrates a perspective view of a conventional optical pickup device.
Figure 16:
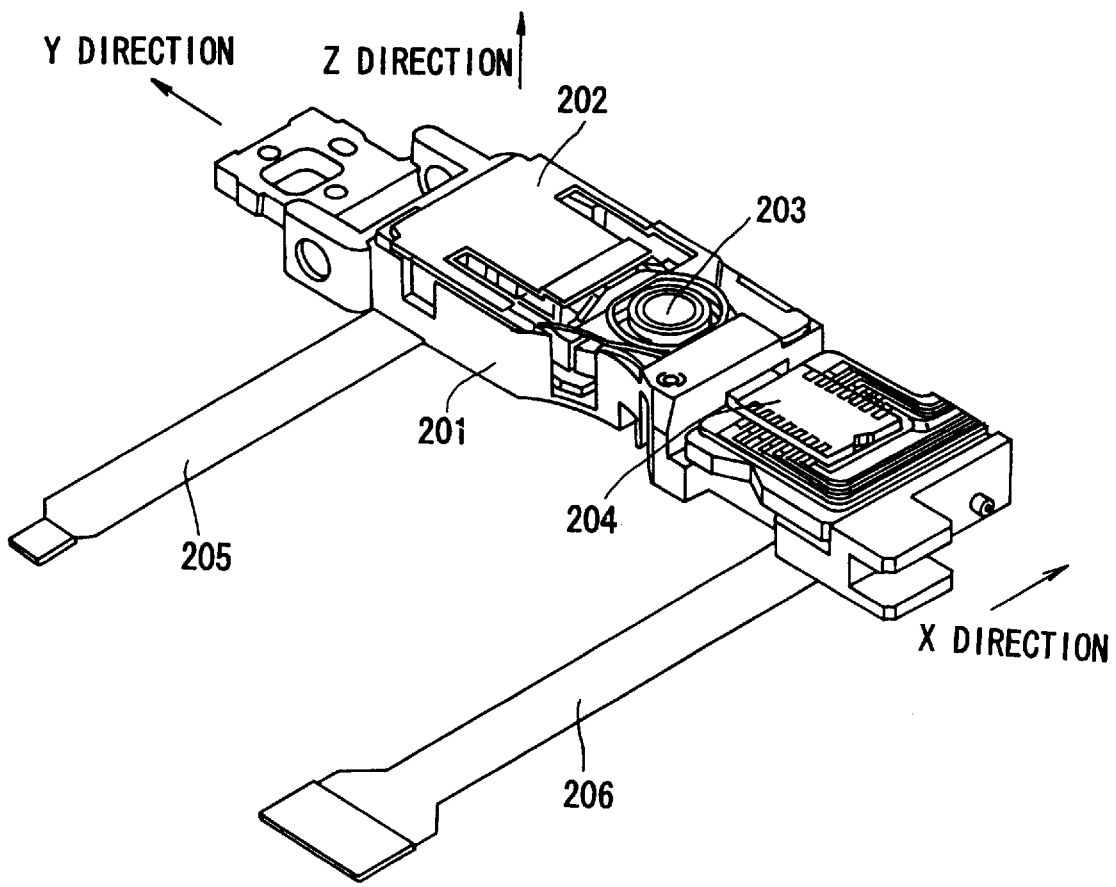
FIG. 16 illustrates a perspective view of another conventional optical pickup device.

With reference to the third embodiment, the laser coupler 11 is attached to the cut-and-bent portion 1a after the cut-and-bent portion 1a is formed by cutting and bending a part of the wiring board 1, the cut-and-bent portion 1a may be made after the laser coupler 11 is attached to the portion 1a. More specifically, as shown in FIG. 14, the wiring pattern 2a can be formed on the wiring board 1 to extend over the portion 1a prior to cutting and bending, and the laser coupler 11 mounted directly on the portion 1a using silver paste, for example. After that, a bonding pad (not shown) along the peripheral portion of the photo diode IC 14 of the laser coupler 11 is bonded to one end of the wiring pattern 2a by the wire 27, and the seal cover 28 is bonded to seal the laser coupler 11. Finally, the portion 1a is cut and bent upward to form the cut-and-bent portion.

As described above, according to the optical pickup device according to the invention, since both the light detect/emit package or light detect/emit substrate with the light emitting portion and the optical signal detecting portion and the biaxial drive portion for driving the objective lens are supported on the wiring board having the connection wiring patterns to electrically connect them to the wiring pattern, the optical pickup device needs no connection substrate material, and can be made in a miniaturized and thin form in a simplified and inexpensive manufacturing process.

Although modifications and changes may be suggested by those skilled in the art, it is the intention of the inventors to embody within the patent warranted hereon all changes and modifications as reasonably and properly come within the scope of their contribution to the art.

What is claimed is:

1. An optical pickup device comprising:
a main wiring board having a wiring pattern for electrical interconnections;
a light detector/emitter device on said wiring board and electrically connected to said wiring pattern and having a light emitting portion and an optical signal detecting portion;
a driveable objective lens secured on the wiring board and horizontally displaced from said light detector/emitter device;
a reflection device positioned over said wiring board between said wiring board and said objective lens, said reflection device operatively positioned and configured to reflect light between said objective lens and said light detector/emitter device; and
a biaxial drive on said wiring board operatively electrically connected to said wiring pattern and configured for driving the objective lens.

2. The optical pickup device of claim 1, wherein the light detector/emitter device is a light detector/emitter package.

3. The optical device according to claim 2, wherein the light detector/emitter package comprises a laser coupler.

4. The optical device of claim 3, wherein the laser coupler has an optical prism and laser chip formed over a photodiode section for detecting an optical signal.

5. The optical device of claim 4, further comprising a separate light detector/emitter wiring board mounted on a recess formed in the main wiring board for the separate light detector/emitter wiring board, the light detector/emitter package being secured on the separate light detector/emitter wiring board.

6. The optical pickup device of claim 1, wherein the light detector/emitter device comprises a separate wiring board secured to said main wiring board.

7. The optical pickup device according to claim 6, wherein said light emitting portion on said separate light detector/emitter wiring board has an optical axis which is oriented approximately 45° with respect to the normal of said main wiring board.

8. The optical pickup device according to claim 6, wherein a predetermined portion of said main wiring board is cut and bent upwardly with respect to normal of the main wiring board, and said separate light detector/emitter wiring board is attached to the cut-and-bent portion.

9. The optical pickup device according to claim 8, wherein said cut-and-bent portion is oriented so as to be substantially normal to said main wiring board.

10. The optical pickup device according to claim 8, wherein said light emitting portion on said separate light detector/emitter wiring board has an common optical axis which is oriented approximately 45° with respect to the normal of said wiring board.

11. The optical pickup device according to claim 6, wherein said main wiring board has a mounting recess in which said separate light detect/emit wiring board is received.

12. The optical pickup device according to claim 6, wherein said separate light detector/emitter wiring board is mounted so as to be oriented substantially normal to said main wiring board.

13. The optical pickup device according to claim 1, further comprising an external connector secured on said wiring board and electrically connected to said wiring pattern.

14. An optical pickup device, comprising:
a) a main wiring board with a wiring pattern for electrical interconnections and a recess for receiving a light detector/emitter wiring board;
b) a light detector/emitter wiring board mounted with the recess of the wiring board;
c) a light detector/emitter package operatively secured on said light detector/emitter wiring board and electrically connected to said wiring pattern;
d) a drivable objective lens secured on said wiring board and horizontally displaced from said light detector/emitter package;
e) a biaxial drive operatively secured on said wiring board and coupled to said objective lens for driving same; and
f) a reflection device positioned over said wiring board between said wiring board and said objective lens, said reflection device operatively positioned and configured to reflect light between said objective lens and said light detector/emitter device,
wherein the light detector/emitter package comprises a laser coupler, and
wherein the laser coupler has an optical prism and laser chip formed over a photodiode section which serves for a detecting optical signal.

15. The optical pickup device according to claim 14, wherein said light detector/emitter wiring board is mounted so as to be oriented substantially normal to said main wiring board.

16. The optical pickup device according to claim 14, wherein said light emitting portion on said light detector/emitter wiring board have an optical axis which is oriented approximately 45° with respect to the normal of said main wiring board.

17. An optical pickup device, comprising:
a) a main wiring board with a wiring pattern for electrical interconnections and a recess for receiving a light detector/emitter wiring board;
b) a light detector/emitter wiring board mounted with the recess of the wiring board;
c) a light detector/emitter package operatively secured on said light detector/emitter wiring board and electrically connected to said wiring pattern;
d) a drivable objective lens secured on said wiring board and horizontally displaced from said light detector/emitter package;
e) a reflection device positioned over said wiring board between said wiring board an said objective lens, said reflection device operatively positioned and configured to reflect light between said objective lens and said light detector/emitter device; and
f) a biaxial drive operatively secured on said wiring board and coupled to said objective lens for driving same, wherein the light detector/emitter package comprises a laser coupler, wherein the laser coupler has an optical prism and laser chip formed over a photodiode section which serves for a detecting optical signal, and wherein, a predetermined portion of said main wiring board is cut and bent upwardly with respect to normal of the wiring board, and said light detector/emitter wiring board is attached to the cut-and-bent portion.

18. The optical pickup device according to claim 17, wherein said light detector/emitter wiring board is mounted so as to be oriented substantially normal to said main wiring board.

19. The optical pickup device according to claim 17, wherein said light emitting portion on said light detector/emitter wiring board have an optical axis which is oriented approximately 45° with respect to the normal of said main wiring board.

* * * * *